(12) United States Patent
Nakazawa (10) Patent No.: US 6,333,519 B1
(45) Date of Patent: Dec. 25, 2001

(54) SEMICONDUCTOR APPARATUS PROCESS FOR PRODUCTION THEREOF AND LIQUID CRYSTAL APPARATUS

(75) Inventor: Toru Nakazawa, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/371,536

(22) Filed: Aug. 10, 1999

(30) Foreign Application Priority Data

Aug. 12, 1998 (JP) .................................................. 10-228165

(51) Int. Cl.⁷ .................................................. H01L 29/04
(52) U.S. Cl. .......................... 257/72; 257/396; 257/397; 257/621; 257/637; 257/708; 257/774
(58) Field of Search .............................. 257/72, 396, 397, 257/621, 637, 708, 774

*Primary Examiner*—Fetsum Abraham
(74) *Attorney, Agent, or Firm*—Fitzpatrick, Cella, Harper & Scinto (57) ABSTRACT

A semiconductor apparatus of the type includes a plurality of semiconductor devices arranged in a matrix and each having a principal electrode, an insulating layer coating the semiconductor devices, and a plurality of pixel electrodes (conductor film patterns) each disposed on the insulating film and connected to the principal electrode of semiconductor device through a contact hole formed in the insulating layer. Such a contact hole can be formed in a minute and accurate size allowing a high-definition pixel arrangement by forming the insulating layer in a laminate structure including first to third insulating layers formed in this order on the substrate, wherein the first and third insulating layers are patterned by etching while using the second insulating layer already provided with an aperture as an etching stopper layer to be provided with an aperture self-aligned with the aperture of the second insulating layer to define the contact hole (the first insulating layer) and into a desired planar shape surrounding the contact hole (the third insulating layer), respectively. The semiconductor apparatus is effectively incorporated in a reflection type liquid crystal display apparatus, suitably providing a projection-type display apparatus.

6 Claims, 11 Drawing Sheets

SEMICONDUCTOR APPARATUS PROCESS FOR PRODUCTION THEREOF AND LIQUID CRYSTAL APPARATUS

FIELD OF THE INVENTION AND RELATED ART

The present invention relates to a semiconductor apparatus, a process for production thereof, and a liquid crystal (display) apparatus including the semiconductor apparatus. Particularly, the present invention relates to a semiconductor apparatus including a semiconductor substrate, and a lower conductor film (principal electrode), an insulating layer and an upper conductor film disposed in this order on the semiconductor substrate so that the lower conductor film and the upper conductive film is electrically connected with each other via a contact hole; a process for production of such a semiconductor apparatus; and also a liquid crystal apparatus including such a semiconductor apparatus.

Accompanying recent development of multi-media technology, there is an increasing demand for apparatus or appliances for communication based on picture data. Among these, a liquid crystal display apparatus has called attention because of a small thickness and a low power consumption, and has grown up to a major industry comparable to semiconductor industry. Such a liquid crystal display apparatus has been principally used as a display panel for a notebook-type personal computer, up to a 10-inch size, etc., but will be adopted as a larger picture-size display not only for a personal computer but also for a work station and a home television set.

However, as the picture size is enlarged, the production apparatus is enlarged and becomes expensive, and the production cost for the liquid crystal apparatus is increased abruptly on a square to cubic order of the picture size.

Accordingly, in resent years, an attention has been called to a projection system wherein a small-size liquid crystal display panel is prepared and a picture thereof is projected in an optically enlarged size. This is because recent development in semiconductor technology regarding a higher density and fine device production has allowed performance improvement and cost reduction based on the scaling rule, so that a small-size liquid crystal display panel having improved performances can be produced at a lower production cost.

In recent years, there has been also noted a reflection type liquid crystal panel (liquid crystal display apparatus) including an active matrix circuit together with a peripheral drive circuit formed on a semiconductor substrate of, e.g., Si, and pixel electrodes for driving the liquid crystal at respective pixels also used as a reflection mirror, because of a low cost and a high picture quality.

FIGS. 16 to 27 are schematic sectional views for illustrating sequential process steps for production of a conventional reflection-type liquid crystal panel applied onto a semiconductor substrate for production of pixel electrode structure. In these figures (and also figures for illustrating structures adopted in the present invention), like members are denoted by like reference numerals.

Figure 16:
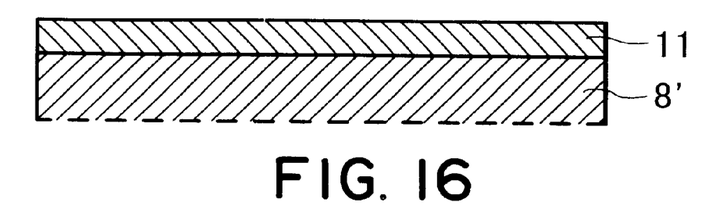
FIGS. 16–27 are schematic sectional views for illustrating steps involved in a conventional process for producing a semiconductor apparatus.
Figure 17:
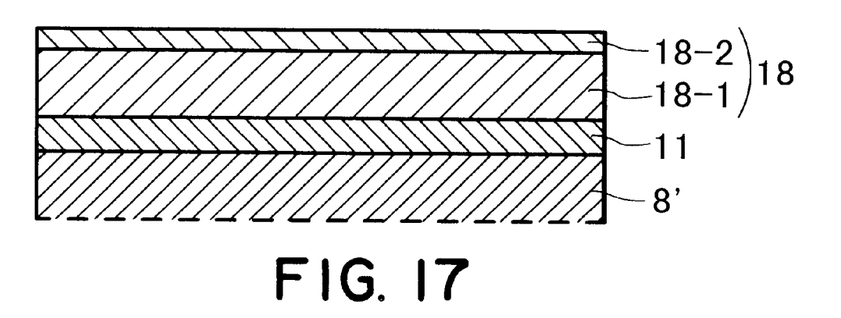
Figure 18:
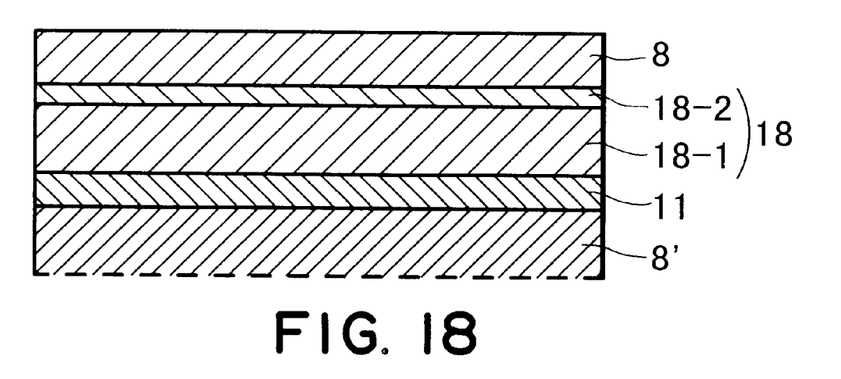
Figure 19:
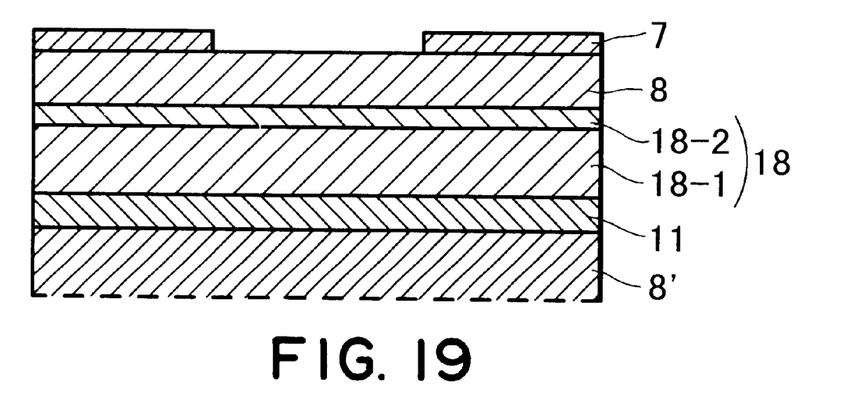

FIG. 16 shows a state wherein a drain electrode 11 has been formed on an insulating layer 8' on a semiconductor substrate (not shown). FIG. 17 shows a state where the drain electrode 11 is further coated with a 5000 Å-thick P-SiO layer 18-1 formed by the plasma CVD process and then with a totally 4400 Å-thick SOG layer 18-2 formed by two times of spin coating of $SiO_2$ precursor solution each for providing a 2200 Å-thick layer for providing an improved smoothness (herein, the prefix "P-" used sometimes to indicate that a layer concerned is formed by the plasma CVD process, and the term "SOG layer" is used to indicate a layer formed by spin coating on a (glass) substrate.

Then, a 4000 Å-thick P-SiO layer 8 is formed as an insulating layer again by the plasma CVD process on the SOG layer 18-2. (FIG. 18) The insulating layer 8 can also be formed as a P-SiN layer formed by the plasma CVD process.

Then, a 3000 Å-thick Ti layer 7 (masking layer) is formed by sputtering, and a portion thereof at a region for providing a through-hole as a contact hole connecting between pixel-drain electrode is removed (FIG. 19), by formation of a photoresist pattern and etching with a $Cl_1/BCl_3$ mixture gas according to an ECR plasma etching apparatus.

Figure 20:
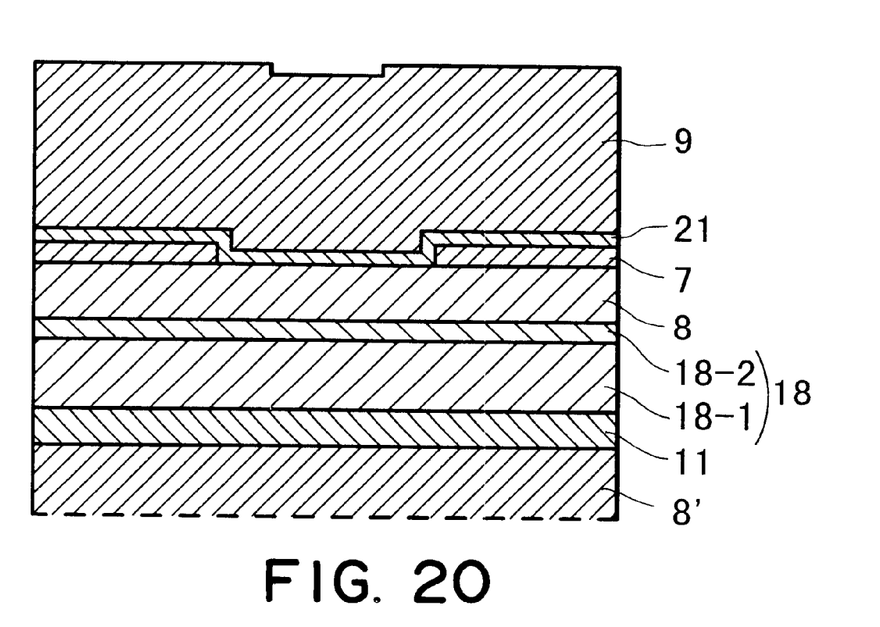

Further, a 4000 Å-thick P-SiN layer 21 (an insulating capacitor film) is formed by the plasma CVD process, and then a 14000 Å-thick P-SiO layer 9 (an insulating layer for pixel electrode separation) is formed by the plasma CVD process. (FIG. 20)

Figure 21:
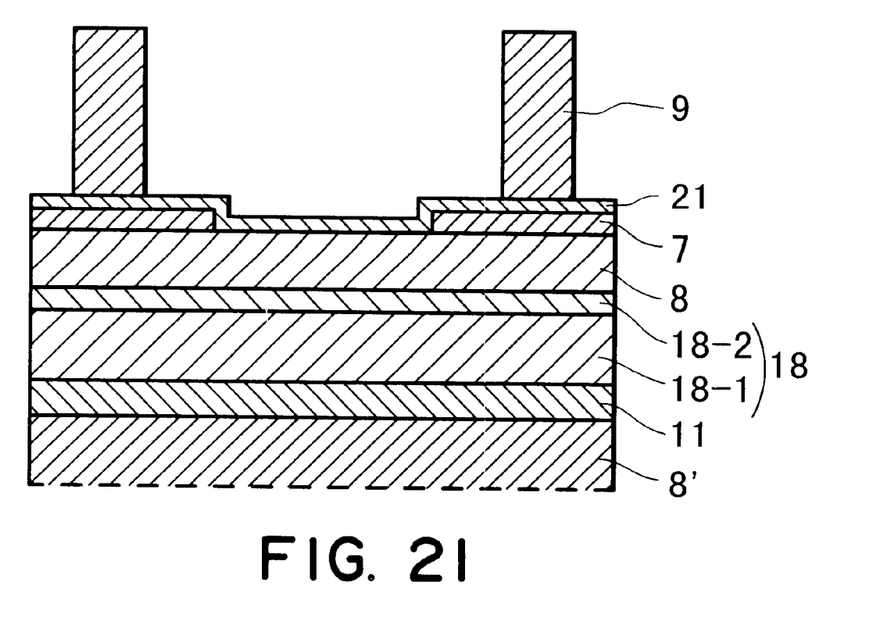
Figure 22:
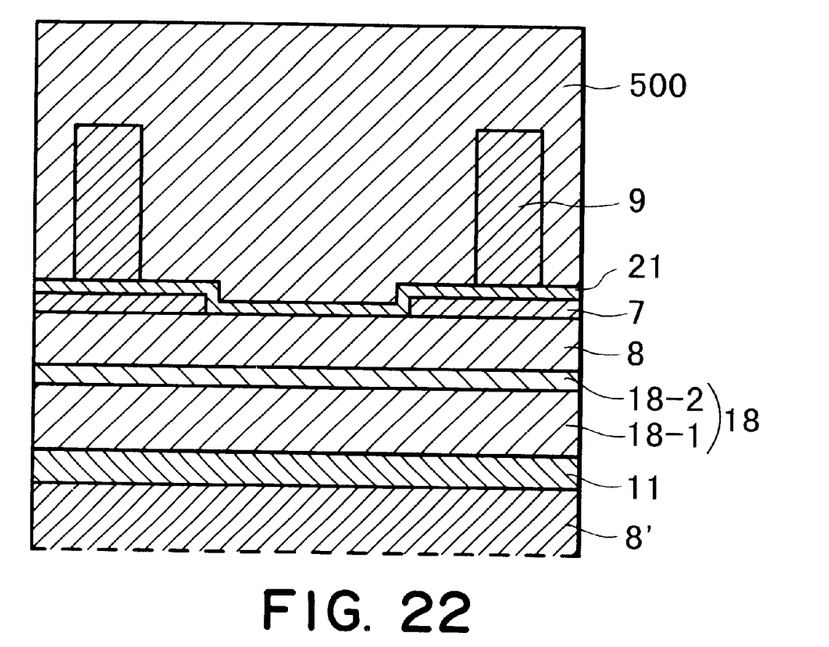

Then, the insulating layer 9 is patterned in a pattern suitable for pixel electrode separation (FIG. 21). The patterning is performed by etching through a patterned photoresist with a $CF_4/Ar$ mixture gas by means of a parallel flat plate plasma etching apparatus under $CF_4/Ar$ gas flow rates of 60/800 ccm ($c^3$/min), a pressure of 1.0 torr and with a 3800 kHz-high frequency power supply of 750 W. Under the etching condition, the P-SiO layer (to be etched) shows an etching rate of 6500 Å/min relative to 2500 Å/min of the lower P-SiN (selection ratio of ca. 2.5) whereby the P-SiN layer 21 functions as the etching stopper layer.

Then, through steps illustrated in FIGS. 22–25, a through-hole for connection between the drain electrode 11 and a pixel electrode is formed. First, a photoresist 500 is applied to cover the patterned insulating layer 9. (FIG. 22) The photoresist 500 is formed in a thickness which is sufficient to cover the patterned insulating layer 8 and will not expose the insulating layer 9 after the etching for providing the through-hole during which the thickness thereof can be reduced by etching. For this reason, the photoresist 500 is required to have a thickness of ca. 2–3 μm above the surface of the insulating layer 21.

Figure 25:
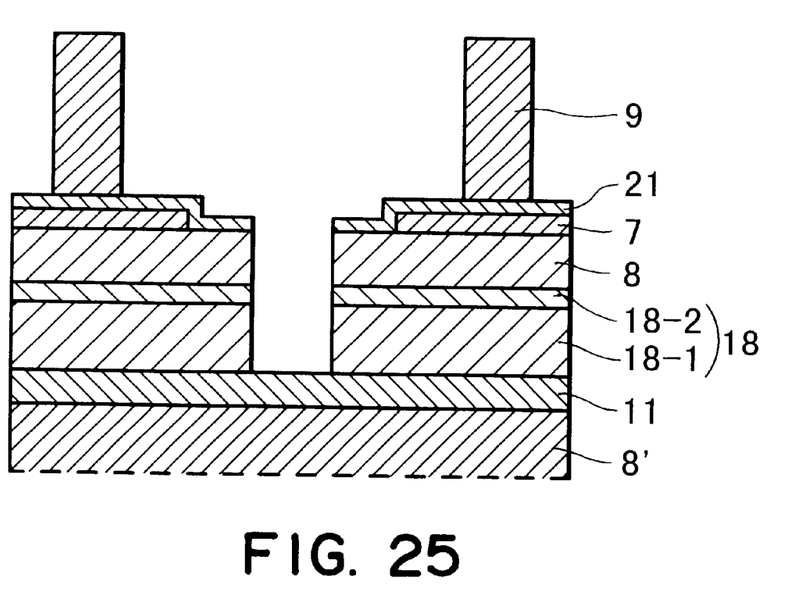
Figure 26:
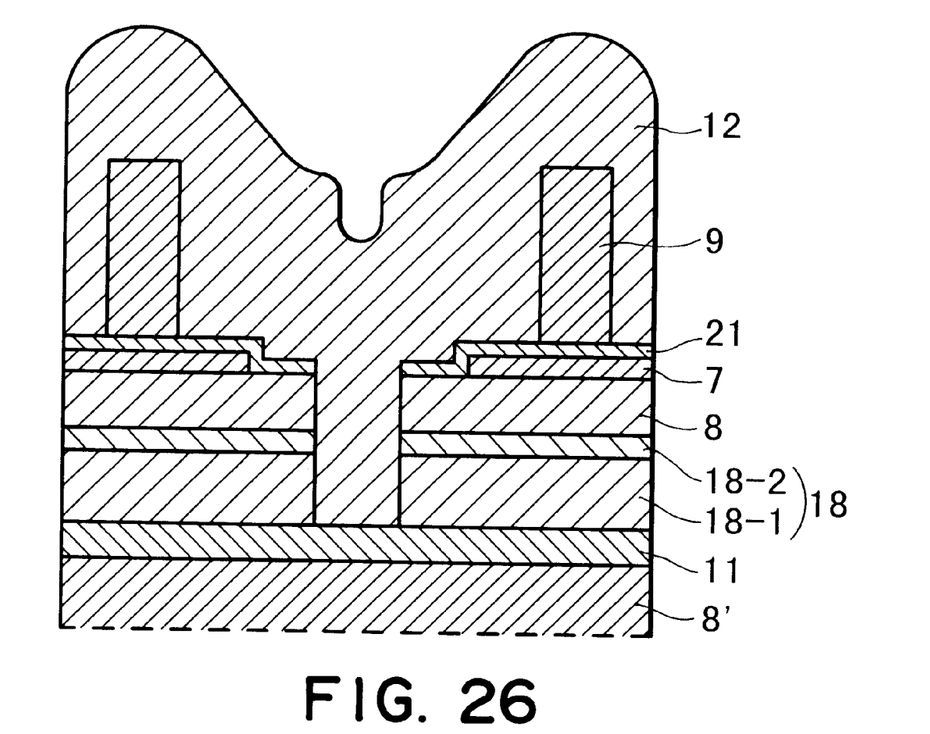
Figure 27:
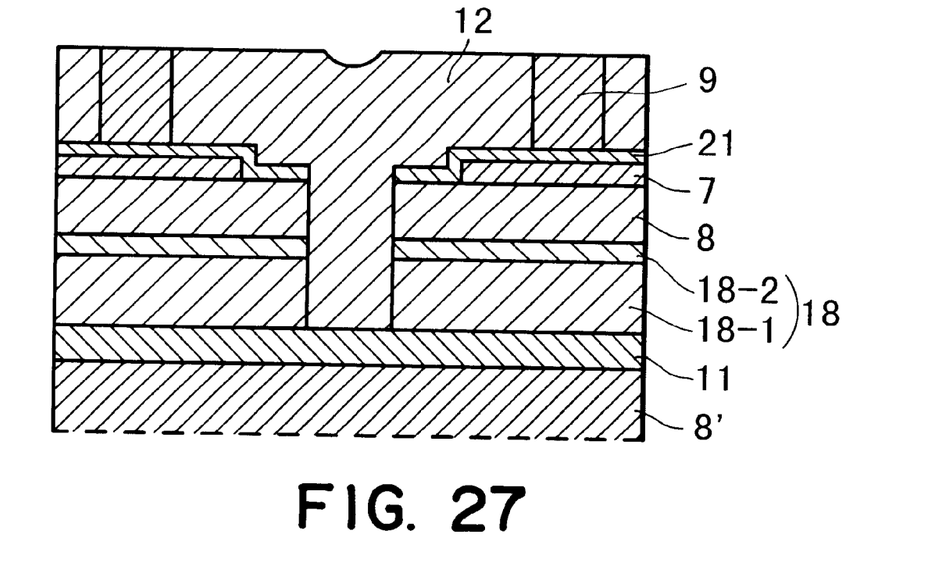

Then, the resist 500 is patterned by exposure and development (FIG. 23), the layers 21, 7, 8 and 18 (18-1 and 18-2) are etched with a $CF_4/CHF_3/Ar$ mixture gas by means of a parallel flat plates plasma etching apparatus (FIG. 24), and then the photoresist 500 is removed (FIG. 25). Then, a pixel electrode film 12 is deposited thereon (FIG. 26), and flattened and separated for respective pixels by the insulating layer 9 by the CMP process (FIG. 27).

Figure 23:
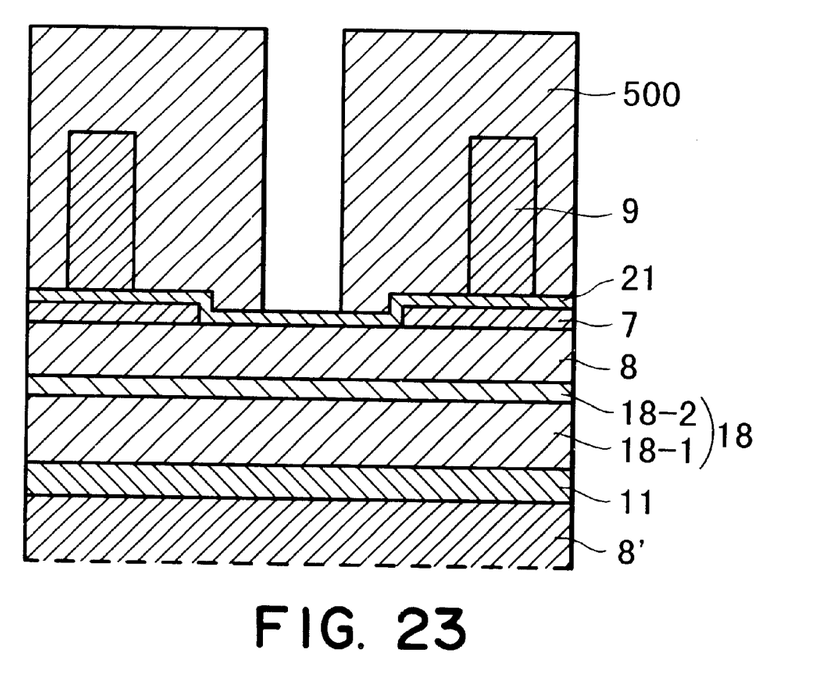
Figure 24:
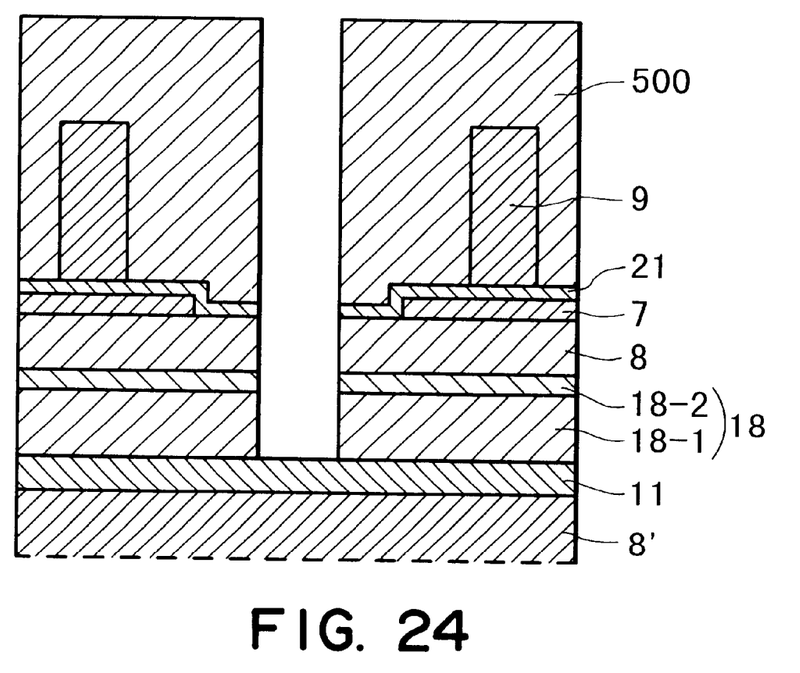

In the above-mentioned prior art process, a large thickness of photoresist 500 is required before formation of the through-hole (FIG. 23). As a result, the minute patterning by exposure and development of the resist 500 (FIG. 22) to provide a patterned resist 500 (FIG. 23) becomes difficult, and further the etching for providing a minute pattern of through-holes (FIG. 24) becomes difficult due to a large aspect ratio (i.e., a ratio of hole depth/hole diameter).

For the above reasons, the formation of minute through holes is difficult to naturally result in a larger size of through holes and also a larger size of pixels, which have obstructed the production of a higher resolution liquid crystal panel.

SUMMARY OF THE INVENTION

In view of the above-mentioned circumstances of the prior art, a principal object of the present invention is to provide a semiconductor apparatus allowing a minute through-hole, a small pixel size and a higher resolution pixel.

Further objects of the present invention are to provide a process for production of such a semiconductor apparatus, and a liquid crystal (display) apparatus including such a semiconductor apparatus.

According to the present invention, there is provided a semiconductor apparatus, comprising a semiconductor substrate, and a laminate structure formed on the semiconductor substrate including a principal electrode of semiconductor device, a laminate insulating layer and a conductor film disposed in this order on the semiconductor substrate, said principal electrode and said conductor film being electrically connected with each other through a contact hole formed within the laminate insulating layer, wherein said laminate insulating layer comprise a first insulating layer provided with an aperture defining the contact hole, a second insulating layer provided with an aperture also defining the contact hole, and a third insulating layer formed in a desired planar pattern surrounding the contact hole disposed in the order named on the semiconductor substrate, and said first and third insulating layers have been patterned through etching with the second insulating layer having the aperture as an etching stopper, and the first insulating layer has been patterned to be provided with the aperture in self-alignment with the aperture of the second insulating layer by the etching.

According to another aspect of the present invention, the above-mentioned semiconductor apparatus is produced through the steps of:

providing a semiconductor substrate having thereon a principal electrode, coating the semiconductor substrate with a first insulating layer, coating the first layer with a second insulating layer and removing a portion of the second insulating layer to provide an aperture defining the contact hole, coating the second insulating layer with a third insulating layer, etching the third insulating layer into a desired pattern and the first insulating layer to provide an aperture, respectively by using the second insulating layer as an etching stopper layer so as to provide the first insulating layer with the aperture in self-alignment with the aperture of the second insulating layer, coating the first to third insulating layers with a conductor film to be electrically connected with the principal electrode, and surface processing the conductor film to provide the conductor film with a desired planar pattern.

In a preferred embodiment of the semiconductor apparatus, a plurality of semiconductor devices each having a principal electrode are disposed on the semiconductor substrate, and each principal electrode is connected through the contact hole with the conductor film patterned into a plurality of pixel electrodes arranged in a matrix.

According to another aspect of the present invention, there is also provided a liquid crystal apparatus, comprising such a semiconductor apparatus having a matrix of pixels, a counter substrate disposed opposite to a side of the semiconductor apparatus provided with the matrix of pixel electrodes, and a layer of liquid crystal disposed between the semiconductor apparatus and the counter substrate.

According to a further aspect of the present invention, there is provided a liquid crystal display apparatus, comprising three liquid crystal panels for color display of blue, red and green, respectively, each having a structure of the above-mentioned liquid crystal apparatus having pixel matrix structure, a light source, a color separation system for separating light from the light source into blue light, red light and green light for illuminating the three liquid crystal panels, and a projection optical system for receiving and projecting reflected blue, red and green light image to form a visible full-color image.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

An embodiment of the present invention regarding the production of a liquid crystal panel having a display region and also including a peripheral region will now be described. Incidentally, the present invention is not only applicable to a liquid crystal panel but also applicable as an effective wire arrangement process for semiconductor apparatus in general. Moreover, the process of the present invention is also effective for formation of contact holes inclusive of minute through-holes (or via holes) during application of the Dual Damascene process using the CMP (Chemical Mechanical Polishing) process.

(First Embodiment)

Figure 1:
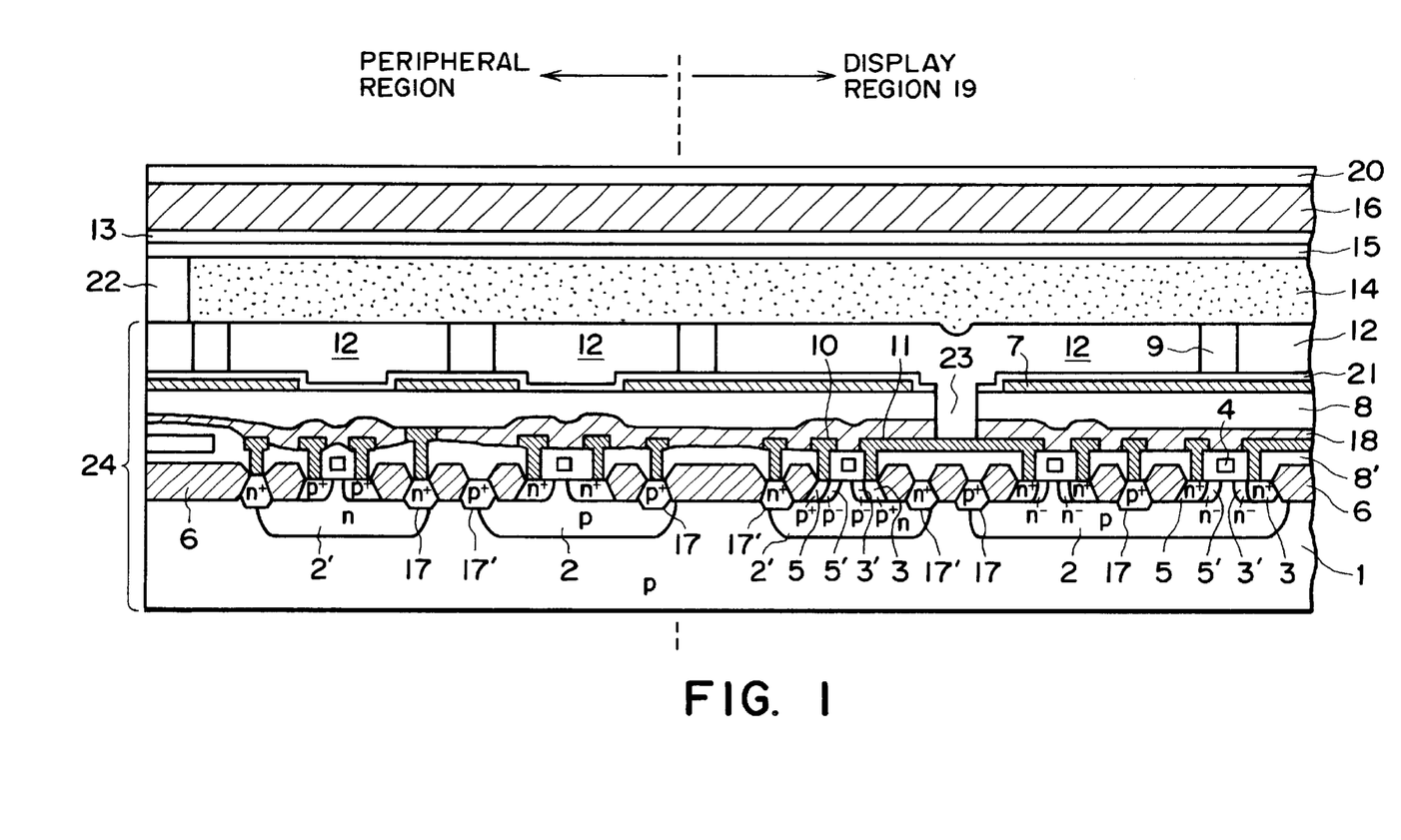
FIG. 1 is a schematic sectional view of a reflection-type liquid crystal display apparatus including a semiconductor apparatus according to the invention.

A section structure of a liquid crystal panel including a semiconductor apparatus of the present invention is shown in FIG. 1, including a semiconductor substrate 1, p-type wells 2, n-type wells, transistor source regions 3,3', gate regions 4 and drain regions 5, 5'.

As shown in FIG. 1, a transistor in a display region is supplied with a high voltage of 20–35 volts and is therefore provided with source and drain regions which are not formed in self-alignment with a gate 4 but offset therefrom, thereby forming a low-concentration n$^-$ layer in a p-well and a low-concentration p$^-$ layer in an n-well as shown in a source region 3' and a drain region 5'. The offset size may suitably be 0.5–2.0 $\mu$m.

On the other hand, in a portion of peripheral circuit in a peripheral region as shown on a left side of FIG. 1, source and drain regions are formed in self-alignment with a gate region. Such a self-alignment structure at a portion of peripheral circuit is allowed because the portion is a logic circuit driven at a low voltage of 1.5–5 volts, and in this case, such a self-alignment structure is desirable in order to reduce the transistor size and improve the drive performances of transistor.

Incidentally, only the source and drain offsets are mentioned above. It is generally effective to determine the presence or absence of such offset and offset sizes, and also optimize the gate length, depending on the withstand voltages of respective transistors.

In the embodiment of FIG. 1, the semiconductor substrate 1 comprises p-type semiconductor, and the substrate potential is placed at a minimum potential (ordinarily, a ground potential), and n-wells in a display region are supplied with a voltage applied to a pixel, i.e., 20–35 volts while supplied with a logic drive voltage of 1.5–5 volts in a portion of the peripheral circuit. By the above arrangement, optimum devices may be constituted depending on drive voltages, and a high density-pixel display can be realized due to not only chip size reduction but also an increase in drive speed.

The semiconductor structure shown in FIG. 1 further includes a field oxide film 6, an insulating layer 8' of, e.g., PSG (phospho-silicate glass), NSG (non-doped silicate glass) or BPSG (boro-phospho-silicate glass), source electrodes 10 connected to data lines, drain electrodes 11 connected to pixel electrodes, and pixel electrodes 12 also functioning as a reflection mirror. A masking layer 7 is further disposed to cover the display region and the peripheral region and may be suitably composed of Ti, TiN, W, Mo or a lamination film formed by a combination of these. The masking layer 7 may be formed by first forming a film over the display region and the peripheral circuit region in a single step of vacuum deposition or sputtering and then patterning the film. As the masking layer 7 is formed so as to cover substantially the entire area of the chip, the illumination light is effectively masked to prevent mal-function of the transistors.

As shown in FIG. 1, the masking layer 7 in the display region is formed to cover the transistors except for connections 23 between the pixel electrodes 12 (conductor film) and the drain electrodes 11 (principal electrodes). However, in the peripheral region, the masking layer 7 is removed from parts of video signal lines and clock signal lines where the increase in line capacitance is not desirable. Further, the parts where the masking layer 7 is removed are covered by an extended layer of the pixel electrodes 12 so as to prevent a possible circuit malfunction due to intrusion of the illumination light.

Further, an insulating layer 8 (first insulating layer) is formed below the masking layer 7 and over a P-SiO layer 18 (i.e., an SiO (silicon oxide) layer formed by the plasma CVD process) after covering the P-SiO layer 18 with a smoothing-SiO (silicon oxide) layer formed through spin coating of an SiO precursor (a smoothing SOG layer) to ensure the planarity of the P-SiO layer 8 formed thereon by the plasma CVD (chemical vapor deposition) process using, e.g., an $SiH_4/O_2$ mixture gas. Alternatively, it is also possible to form an SiO layer 18 by the plasma CVD process using tetraethoxysilane and smoothing the P-SiO layer by the CMP process before forming thereon the P-SiO layer 8.

Further, an insulating layer (third insulating layer) 9 is formed between the pixel electrodes 12 so as to separate the respective pixel electrodes 12. The insulating layer 9 may suitably be formed of P-SiO. Further, an insulating layer (second insulating layer) 21 is formed between the reflective pixel electrodes 12 and the making layer 7 so as to provide a retention capacitance. The insulating layer 21 may suitably comprise a high dielectric material, such as P-SiN.

Each of the masking layer 7, the insulating layer 9, the insulating layer 21 and the reflection electrode 12 is formed in a single step over the peripheral region and the display region 19. A layer 14 of a liquid crystal material, such as PNLC (polymer network liquid crystal) or PDLC (polymer dispersed liquid crystal) is disposed between a semiconductor apparatus 24 including the above-mentioned members and a transparent counter substrate 16. The counter substrate 16 has thereon an reflection-preventing film 13 and a common transparent electrode 15 disposed opposite to the reflective pixel electrodes 12, and also a reflection-preventing film 20 on the other side. The counter substrate 16 and the semiconductor apparatus or substrate 24 are held with each other via a sealing member 22 which also controls a gap between the substrates. The transistors further include high-concentration impurity regions 17, 17.

The reflection preventing film 13 is disposed between the common transparent electrode 15 and the counter substrate 16 so as to alleviate the boundary reflection in consideration of the refractive index of the liquid crystal at the boundary. The reflection-preventing layer 13 may suitably be provided as an insulating layer having a lower refractive index than the counter substrate 16 and the transparent electrode 15.

As shown in FIG. 1, the high-impurity regions 17, 17' of the same polarity as the wells 2, 2' formed at lower parts of the transistors are formed within or in the vicinity of the wells 2, 2'. As a result, even if a high-amplitude signal is applied to the source, the well potential is stably fixed at a desired potential by the low-resistivity layer, thereby allowing a high-quality picture display. Further, between the n-type well 2' and the p-type well 2, the high-impurity regions 17 and 17' are disposed via the field oxide film 6, thereby unnecessitating a channel stop layer beneath a field oxide film generally used in a MOS transistor.

The high-impurity regions 17, 17' are simultaneously produced in the source and drain production steps, so that the numbers of masks and steps in the production process can be reduced to allow a lower cost production.

As shown in FIG. 1, the well region 2' is composed of a conductivity type opposite to that of the semiconductor substrate 1. In this embodiment, the well region 2 is made of p-type, so that the p-type region 2 and the n-type region 2' are preferably doped with higher concentrations of impurities than the semiconductor substrate 1. More specifically, it is desired that, when the semiconductor substrate 1 has an impurity concentration of $10^{14}$–$10^{15}$ (cm$^{-3}$), the well region 2 has an impurity concentration of $10^{15}$–$10^{17}$ (cm$^{-3}$).

The source electrode 10 is connected to a data for receiving display signals, and the drain electrode 11 is connected to a pixel electrode 12. These electrodes 10 and 11 may ordinarily comprise a conductor material, such as Al, AlSi, AlSiCu, AlGeCu, or AlCu. If a barrier metal layer of Ti or TiN is disposed below these electrodes 10 and 11 at contacting surfaces with the semiconductor, a stable contact can be realized and the contact resistance can be reduced.

The pixel electrodes 12 may preferably have a flat surface and comprise a highly reflecting material which may be an ordinary electrode conductor, such as Al, AlSi, AlSiCu, AlGeCu or AlCu and can also comprise another material such as Cr, Au or Ag. It is also possible to use high temperature Al having a reflow characteristic (i.e., Al layer deposited on a substrate heated at a high temperature around 400° C. so as to provide the Al layer with a reflow characteristic (some fluidity of as-deposited Al) for improved filling of the contact hole) to form flat pixel electrodes 12.

Then, in the final step of the semiconductor apparatus production, the surface of the pixel electrodes 12 is treated by the CMP process to simultaneously realize an increased flatness and separation of the respective pixel electrodes 12.

Next, the method of pixel electrode structure formation process including a step of forming a through hole (sometimes also called a via hole) 23 as a characteristic feature of the present invention, will be more specifically described with reference to FIGS. 2 to 14.

Figure 2:
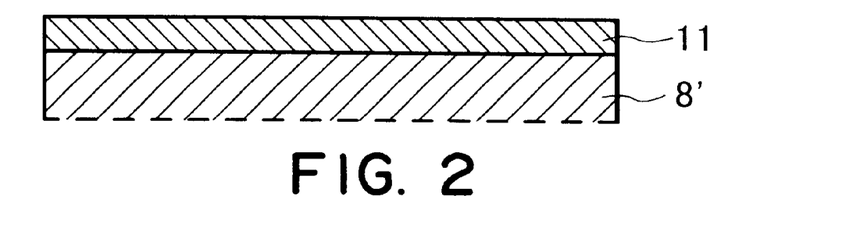
FIGS. 2–14 are schematic sectional views for illustrating steps involved in a process for producing a semiconductor apparatus according to the invention.
Figure 3:
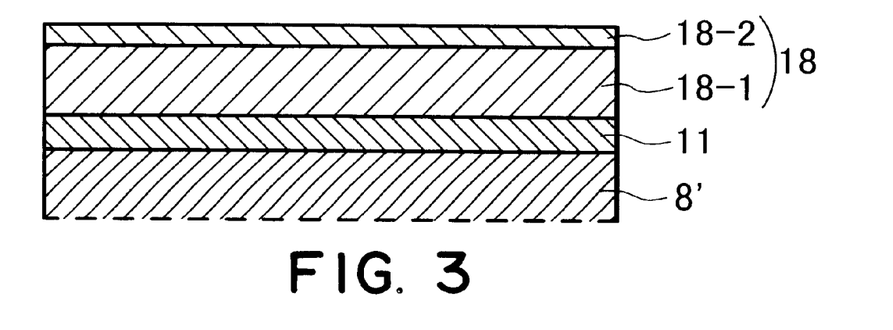

FIG. 2 shows a state wherein a drain electrode 11 (principal electrode) has been formed on an insulating layer 8'. Then a 5000 Å-thick P-SiO layer 18-1 is formed thereon by the plasma CVD process using, e.g., a $CH_4+O_2$ mixture gas, and a totally 4400 Å-thick (as coated) SiO layer 18-2 is further formed thereon by two times of spin coating each for providing a 2200 Å-thick layer for providing an improved surface-smoothness (FIG. 3). More specifically, the smoothing SiO layer (SOG layer) 18-2 is formed by two times of spin coating with an SiO precursor liquid (e.g., a silanol/ organic solvent mixture) with intermediate drying, e.g., at 220° C. for 1 min. and exposure with UV rays of the first coating layer, and final calcination of the SiO precursor liquid layers coated twice, e.g., at 400° C. for 30 min. The spin coating is performed in two steps as described above in order to obviate the cracking of the SiO layer 18-2 possibly caused by a single step of spin coating and to provide an improved surface smoothness.

Figure 4:
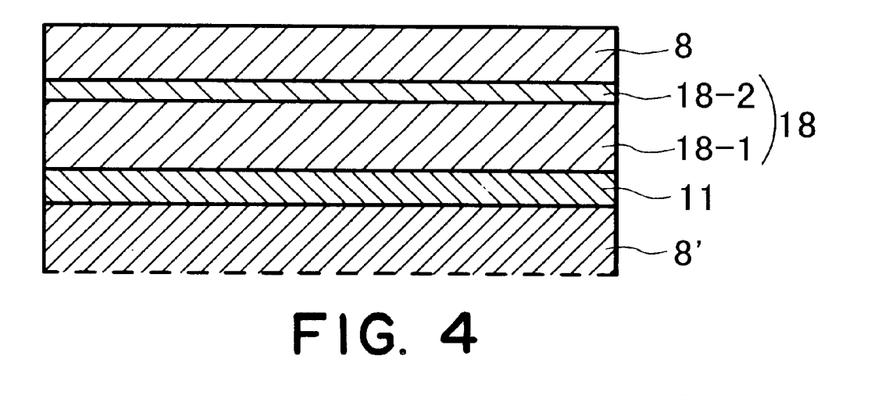
Figure 5:
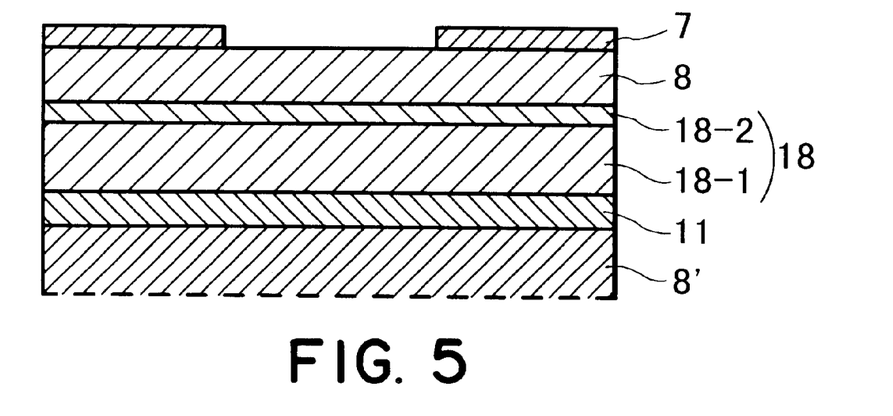

Then, the smoothing SiO layer (SOG layer) 18-2 is coated with a 4000 Å-thick P-SiO layer 8 (first insulating layer) by the plasma CVD process (FIG. 4). Then, a 3000 Å-thick Ti layer is formed by sputtering and patterned into a masking layer 7 by removal of a portion thereof corresponding to a through-hole 23, etc., through steps including formation of a patterned film of photoresist and etching with a $Cl_2/BCl_3$ mixture gas by means of an ECR (electron cyclotron resonance) plasma etching (FIG. 5).

Figure 6:
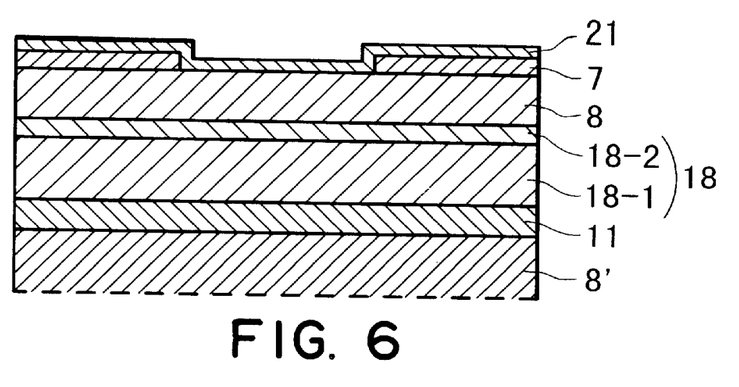

Then, an insulating layer 21 (second insulating layer) is formed for providing a capacitance between the pixel electrode 12 (conductor film) and the masking film 7 (FIG. 6). The insulating layer 21 may be formed of, e.g., a 4000 Å-thick P-SiN layer by the plasma CVD process which thickness may be selected depending on the switching characteristic and withstand voltage of the device but can be different thicknesses.

Figure 7:
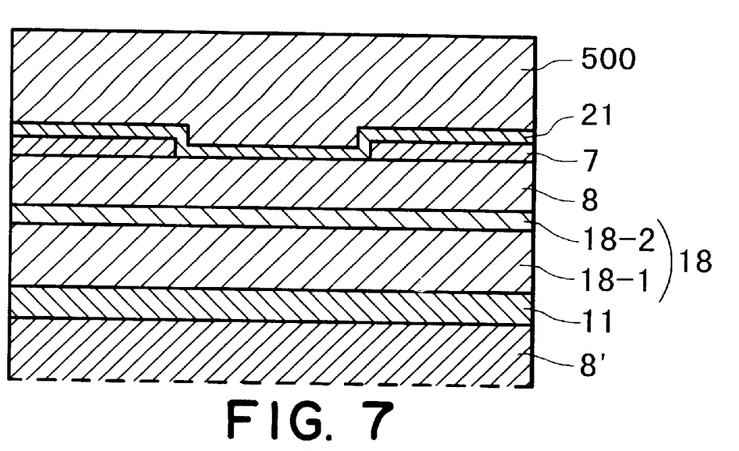

Then, a portion of the insulating layer 21 corresponding to the through-hole 23 is removed through step shown in FIGS. 7–10, including application of a layer of photoresist 500 (FIG. 7). The photoresist layer 500 formed in this step need not have a thickness large enough to cover a step (of the insulating film 9 shown in FIG. 22) as in the conventional process but may only require a thickness which is required as a mask (etching stopper) when the P-SiN layer in a thickness of, e.g., 4000 Å, is etched.

In this embodiment, a ca. 1 $\mu$m-thick i-ray resist layer may be used as the photoresist layer 500. It is possible to apply a BORC (bottom anti-reflective coat) film below the resist application. Alternatively, it is also possible to form an excimer laser resist film as the resist film 500 for exposure with an excimer stepper laser so as to allow an accurate and high definition resist patterning.

Figure 8:
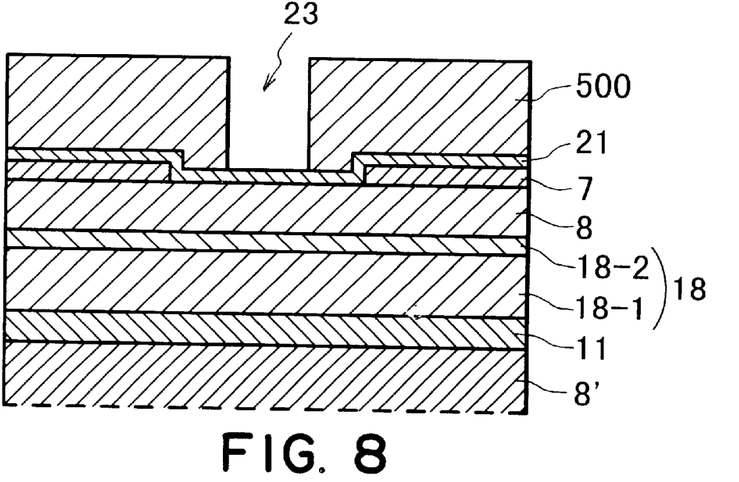
Figure 9:
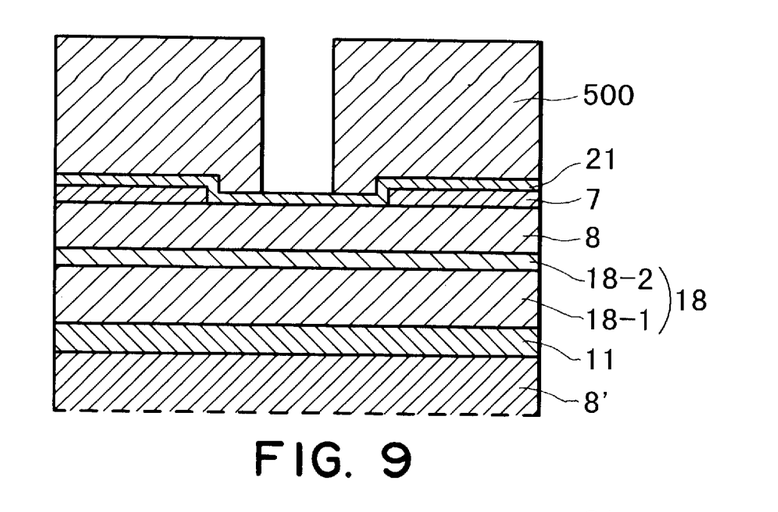

Then, the photoresist layer 500 is exposed to i-rays (or i-line rays) from a stepper and then developed to form a patterned resist layer 500 (FIG. 8). As the resist layer 500 is much thinner than in the conventional process, a fine resist patterning becomes possible. Then, the insulating layer 21 is etched through the resist 500 with a $CF_4$/Ar mixture gas by means of a parallel flat plate-type plasma etching apparatus using a 380 kHz-high frequency power supply (FIG. 9). Incidentally, the patterning of the P-SiN layer 21 can also be effected by etching with $SF_6$ as an etchant gas by means of an ECR plasma etching apparatus, so as to ensure a high selectivity relative to the P-SiO layer below it, thereby allowing a simpler control of etching time, etc.

Figure 10:
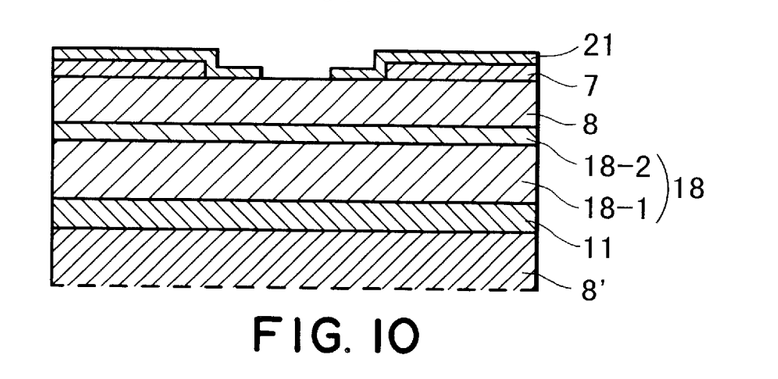
Figure 11:
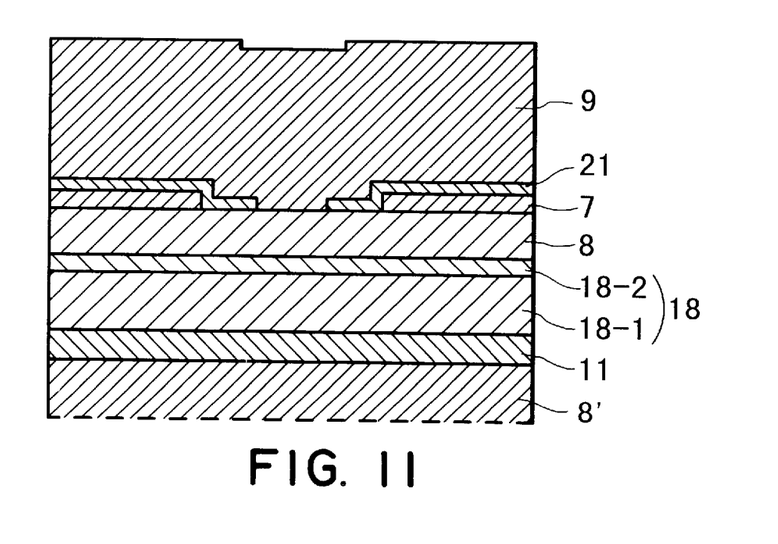

Then, the semiconductor substrate is subjected to ashing with oxygen plasma and treated with an organic alkali solution to completely remove the resist (500) and polymer possibly formed during the etching (FIG. 10). Further, an insulating layer 9 (third insulating layer) is formed over the insulating layer 21 for providing a pattern for separating pixel electrodes. The insulating layer 9 may for example be formed as a 14000 Å-thick P-SiO layer by the plasma CVD process.

Figure 12:
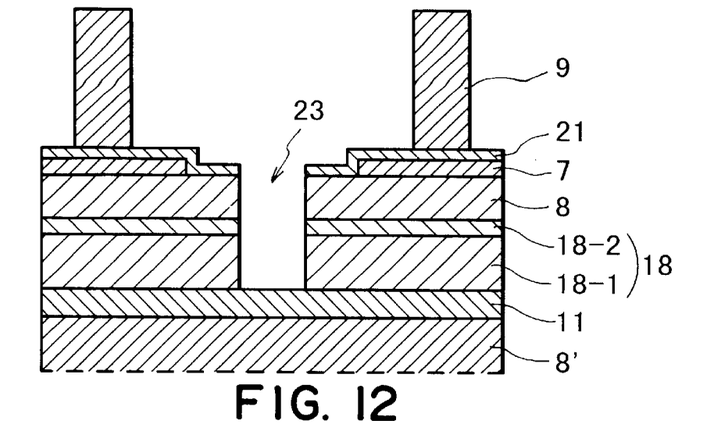

Then, the insulating layer 9 is patterned into a pattern suitable for separation of pixel electrodes by etching through a photomask (of phenol novalak resin-based i-ray resist) formed thereon in the pattern while using the insulating layer 21 as another etching stopper pattern for further etching of the P-SiO layer 8, the smoothing SiO layer 18-2 and the P-SiO layer 18-1 to form, e.g., a 1.0 $\mu$m-dia. circular through-hole 23 in self-alignment with the opening of the insulating layer 21 (FIG. 12). The etching of the layers 9, 8, 18-2 and 18-1 may be performed with a $C_4F_8/O_2$/Ar (30/9/ 200) mixture gas or a $C_4F_8/O_2$/CO mixture gas e.g., at a presence of 4 m Torr by means of an ECR plasma etching apparatus with a microwave power of 1500 W and an RF power of 500 W until the through-hole 23 reaches the drain electrode 11. It is also possible to use a $CF_4/CF_3$/Ar (=35/ 15/400) at a pressure of 300 m Torr in a parallel flat plate-type plasma etching apparatus at power of 900 W and 300 kHz. The etching may be effected at a P-SiO/P-SiN selectivity ratio of ca. 10–20, or at a infinitely large ratio depending on the condition therefor, so that the through-hole 23 can be formed effectively with the insulating layer 21 as an etching mask pattern.

Figure 13:
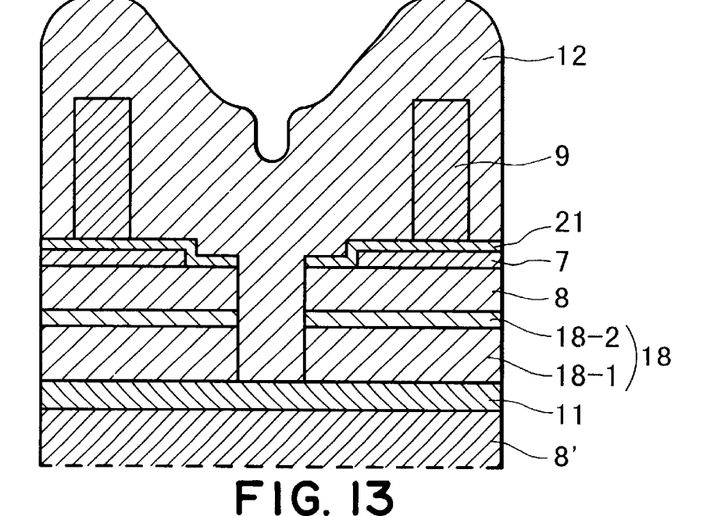
Figure 14:
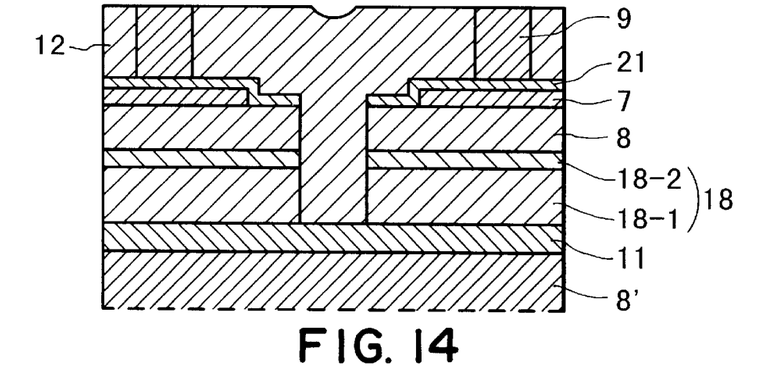

Then, on the structure shown in FIG. 12, a pixel electrode film 12 may be formed of high-temperature Al (aluminum) (FIG. 13). More specifically, on the structure shown in FIG. 12, a 2000 Å-thick TiN layer and then a 300 Å-thick Ti layer are deposited by sputtering in order to prevent the reaction between the insulating layer 21 and Al and improve the reflow characteristic of the high-temperature Al to be formed thereon. Then, a 7000 Å-thick Al layer is formed thereon without heating the substrate so as to prevent island-form deposition of Al possibly formed by deposition high-temperature Al, and then finally a 17000 Å-thick high-temperature Al layer is formed by sputtering while heating the substrate at 425° C., followed by holding at 125° C. for several minutes after the sputtering to effect, so-called re-flowing of the Al layer, in order to realize improved filling of the contact hole 23. Incidentally, the film structure including the respective layer thicknesses of the pixel electrode film, the substrate temperature for high-temperature Al layer formation and the subsequent holding time for formation of the pixel electrode film formation may appropriately be selected in view, e.g., the reflow characteristic and a required degree of embedding due to the reflowing determined depending on a shape and a diameter of through-holes. In addition to the high-temperature Al, the pixel electrode film 12 may also be formed of another conductor material, such as Al, AlSi, AlSiCu, AlGeCu, AlCu, Cr, Au or Ag, as mentioned above, formed by ordinary process of sputtering or vacuum evaporation.

Then, the thus-formed pixel electrode film 12 (FIG. 13) is polished by the CMP process using, e.g., a polishing cloth of polyurethane and a polishing slurry mixture of ammonia and colloidal silica until the pixel electrode-separating insulating layer 9 therebelow is exposed, thereby effecting the pixel electrode separation and the surface-smoothing simultaneously.

According to the above-mentioned embodiment of the process of the present invention, minute through-holes can be accurately formed, whereby each pixel size can be minimized to allow the production of a higher-resolution liquid crystal panel.

Figure 15:
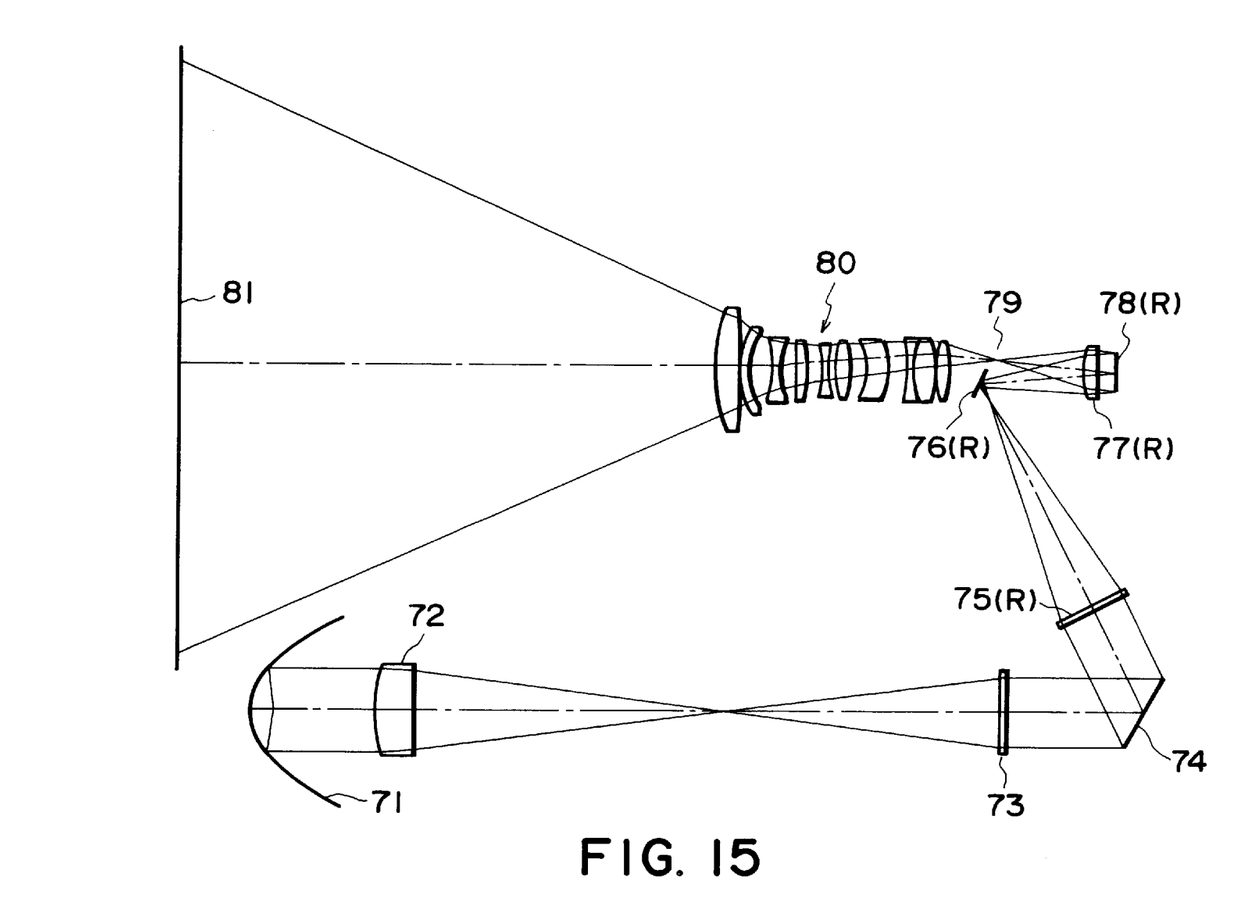
FIG. 15 illustrates an organization of an optical system including a liquid crystal display apparatus according to the invention as a liquid crystal projector.

FIG. 15 illustrates an organization of an optical system for projection-type display apparatus including a reflection-type liquid crystal panel equipped with a semiconductor apparatus having a characteristic structure according to the present invention. Roughly speaking, the optical system includes at least three liquid crystal panels for at least three colors of display, a blue-reflection dichroic mirror for separation of blue light, a red-reflection dichroic mirror for separation of red light, and a green/blue-reflecting dichroic mirror for separation of green light, disposed preferably in this order, to illuminate the respective liquid crystal panels for projection display.

In the optical system shown in FIG. 15, only the red color display system is shown and the other blue and green display systems are omitted from showing. Referring to FIG. 15, the optical system includes a light source 71 such as a halogen lamp, a condenser lens 72 for condensing a source light image, a planar Fresnel convex lens 73, a color-separation optical device 74, such as a dichroic mirror or a diffraction grating, for color separation into R, G and B, planar Fresnel lenses 74 (only one being shown), mirrors 76 (only one being shown) for guiding respective separated lights to the respective color liquid crystal display panels, field lenses 77 for receiving condensed lights and illuminating the respective reflection-type liquid crystal panels with parallel lights, the reflection-type liquid crystal panels 78, a stop 79, a projection lens system 80 and a projection screen 81. The screen 81 may ordinarily comprise a Fresnel lens for converting projected light to parallel light and a lenticular lens for allowing a display with vertically and laterally wide viewing angles, so as to provide a bright picture with a clearly high contrast. As mentioned above, FIG. 15 shows only one color display system, but members (75–78) between the color-separation optical device 74 and the stop 79 are each provided in a set of at least three members for display of at least three colors.

In operation, regularly reflected light from respective pixels of each liquid crystal device 78 (R) driven under application of drive voltage is passed through the stop 79 and projected onto the screen 81. On the other hand, light having entered pixels not supplied with a voltage but comprising a liquid crystal layer in a scattering state of the reflective liquid crystal device 78 is isotropically scattered to generally fail in entering the aperture angle of the stop 79 and thus the projection lens 80, thus providing black spots on the screen 81.

As is understood from the above explanation of the optical system, each liquid crystal device 78 does not require a polarizer, and each signal light reflected at a high reflectance from the entire area of each pixel electrode can enter the projection lens 79, so that a bright display of 2 to 3 times as bright as in the conventional system can be realized. Further, by providing the counter substrate with an antireflection treatment on both the outer surface and the boundary with the liquid crystal layer, it is possible to realize a high contrast display with extremely low noise light component. Further, as the panel size can be minimized, all the associated optical devices, such as lenses and mirrors, can be reduced in size, thus allowing a lighter apparatus with a lower production cost. Further, irregularity or fluctuation in color and luminance can be removed on the screen by inserting an integrator of the fly-eye lens-type or the rod lens-type.

As described above, according to the present invention, it is possible to provide a semiconductor apparatus wherein minute through-holes can be produced accurately with little production margin or irregularity. As a result, the unit pixel size can be reduced to allow the production of a high-definition liquid crystal panel. Further, by incorporating the liquid crystal panel in a liquid crystal display apparatus system, such as a projection-type liquid crystal display apparatus including peripheral circuits and optical systems, a high-definition display can also be realized.

What is claimed is:

1. A semiconductor apparatus, comprising a semiconductor substrate, and a laminate structure formed on the semiconductor substrate including a principal electrode of semiconductor device, a laminate insulating layer and a conductor film disposed in this order on the semiconductor substrate, said principal electrode and said conductor film being electrically connected with each other through a contact hole formed within the laminate insulating layer, wherein said laminate insulating layer comprise a first insulating layer, a second insulating layer, and a third insulating layer disposed in this order, each of said first, second and third insulating layers being respectively provided with first, second and third apertures defining said contact hole, said first and said second apertures being of the same shape and alignment and said third aperture being formed in a desired planar pattern surrounding said first and second apertures, and said first and third apertures have been patterned through etching of the first and third insulating layers with the second insulating layer as an etching stopper, said second insulating layer already having its second aperture.

2. A semiconductor apparatus according to claim 1, wherein said first insulating layer has a laminate structure including an insulating layer formed through spin coating.

3. A semiconductor apparatus according to claim 1 or 2, wherein a plurality of semiconductor devices each having a principal electrode are disposed on the semiconductor substrate, and each principal electrode is connected through the contact hole with the conductor film patterned into a plurality of pixel electrodes arranged in a matrix.

4. A process for producing a semiconductor apparatus of the type comprising a semiconductor substrate, and a laminate structure formed on the semiconductor substrate including a principal electrode of semiconductor device, a laminate insulating layer and a conductor film disposed in this order on the semiconductor substrate, said principal electrode and said conductor film being electrically connected with each other through a contact hole formed within the laminate insulating layer; said process comprising the steps of:

providing a semiconductor substrate having thereon a principal electrode, coating the semiconductor substrate with a first insulating layer, coating the first insulating layer with a second insulating layer and removing a portion of the second insulating layer to provide an aperture defining the contact hole, coating the second insulating layer with a third insulating layer, etching the third insulating layer into a desired pattern and the first insulating layer to provide an aperture, respectively by using the second insulating layer as an etching stopper layer so as to provide the first insulating layer with the aperture in self-alignment with the aperture of the second insulating layer, coating the first to third insulating layers with a conductor film to be electrically connected with the principal electrode, and surface processing the conductor film to provide the conductor film with a desired planar pattern.

5. A liquid crystal apparatus, comprising a semiconductor apparatus according to claim 3, a counter substrate disposed opposite to a side of the semiconductor apparatus provided with the matrix of pixel electrodes, and a layer of liquid crystal disposed between the semiconductor apparatus and the counter substrate.

6. A liquid crystal display apparatus, comprising three liquid crystal panels for color display of blue, red and green, respectively, each having a structure of the liquid crystal apparatus according to claim 5, a light source, a color separation system for separating light from the light source into blue light, red light and green light for illuminating the three liquid crystal panels, and a projection optical system for receiving and projecting reflected blue, red and green light images to form a visible full-color image.

* * * * *

UNITED STATES PATENT AND TRADEMARK OFFICE
CERTIFICATE OF CORRECTION

PATENT NO.    : 6,333,519 B1
DATED         : December 25, 2001
INVENTOR(S)   : Toru Nakazawa It is certified that error appears in the above-identified patent and that said Letters Patent is hereby corrected as shown below:

<u>Title page, Item [54], and Column 1,</u>
Line 1, "APPARATUS PROCESS" should read -- APPARATUS, PROCESS --.
Item [57], ABSTRACT,
Line 1, "of the type" should be deleted:
Line 6, "of" should read -- of the --;
Line 14, "as an etching stopper" should read -- (as an etching stopper) --;
Line 15, "layer to be provided with an aperture" should be deleted --…

<u>Column 1,</u>
Line 36, "resent" should read -- recent --.

<u>Column 2,</u>
Line 5, "substrate." should read -- substrate). --;
Line 37, "layer 8" should read -- layer 9 --;
Lines 60 and 61, "through" should read -- through --;

<u>Column 3,</u>
Line 17, "comprise" should read -- comprises --.

<u>Column 4,</u>
Line 10, "image" should read -- images --;
Line 42, "via holes)" should read -- via-holes) --;
Line 49, "wells," should read -- wells 2', --;
Line 67, "transistor." should read -- transistors. --.

<u>Column 5,</u>
Line 31, "mal-function" should read -- malfunction --;
Line 47, "smoothing-" should read -- smoothing --;
Line 61, "making" should read -- masking --.

<u>Column 6,</u>
Line 9, "or substrate 24" should read -- 24 or substrate 1 --;
Line 12, "regions 17, 17." should read -- regions 17, 17'. --;
Line 44, "a data" should read -- data source --;
Line 67, "through hole" should read -- through-hole --.

UNITED STATES PATENT AND TRADEMARK OFFICE
CERTIFICATE OF CORRECTION

PATENT NO. : 6,333,519 B1
DATED : December 25, 2001
INVENTOR(S) : Toru Nakazawa

It is certified that error appears in the above-identified patent and that said Letters Patent is hereby corrected as shown below:

<u>Column 7,</u>
Line 1, "via hole" should read -- via-hole --;
Line 30, "etching" should read -- etching apparatus --;
Line 40, "step" should read -- the steps --;
Line 50, "BORC" should read -- BARC --.

<u>Column 8,</u>
Line 19, "gas" should read -- gas, --.

<u>Column 9,</u>
Line 53, "lens 79," should read -- lens 80, --.

<u>Column 10,</u>
Line 11, "of" should read -- of a --;
Line 17, "comprise" should read -- comprises --;
Line 43, "of" should read -- of a --.

Signed and Sealed this

Twenty-fifth Day of June, 2002

*Attest:*

*Attesting Officer*

JAMES E. ROGAN
*Director of the United States Patent and Trademark Office*